Oct. 28, 1969 A. G. COBLENZ 3,475,660

HOLLOW CYLINDRICAL SEMICONDUCTOR DEVICE

Filed Dec. 1, 1967

INVENTOR.
ABRAHAM G. COBLENZ

BY

OSTROLENK, FABER, GERB & SOFFEN

ATTORNEYS 3,475,660

HOLLOW CYLINDRICAL SEMICONDUCTOR DEVICE

Abraham G. Coblenz, El Segundo, Calif., assignor to International Rectifier Corporation, El Segundo, Calif., a corporation of California Filed Dec. 1, 1967, Ser. No. 687,364
Int. Cl. H01l 1/12
U.S. Cl. 317—234 9 Claims

ABSTRACT OF THE DISCLOSURE

A monocrystalline semiconductor device formed as a hollow cylinder having a cylindrical junction therein. Radial current flow through the junction is taken from electrodes on the inner and outer diameters of the hollow cylinder. A liquid mercury layer is used for a portion of the electrodes and coolants flow through the center and over the outer diameter of the cylinder.

This invention relates to semiconductor rectifiers, and more particularly relates to a high current capacity rectifier having a hollow cylindrical form.

Semiconductor devices are commonly formed by providing suitable P-N junctions in a thin flat wafer of semiconductor material. As the current rating of the device increases, the wafer diameter is increased. As the wafer gets larger, however, severe problems are encountered in securing electrodes to the wafer, housing the wafer, and removing heat from the wafer at suitable rates. In the case of a 500 ampere rectifier device, a wafer of silicon having a diameter 1$\frac{3}{16}$ inches will be used. The problems of making contact to the thin, brittle wafer, such as voids, blisters, cracking of the wafer, and the like, are such that it is common to have a 60% rate of rejection of devices. When current ratings of 600 amperes and above are desired, these problems become further exaggerated and yield rates are substantially decreased.

In accordance with the present invention, the wafer shape is changed from the conventional flat wafer to a hollow cylinder. The P-N rectifying junction is formed in a cylindrical shape embedded in the cylindrical semiconductor shape. For example, an N-type cylindrical ingot of silicon can be formed, and a suitable height cylinder is cut from the ingot. A central portion of the slab is then removed as by etching or reaming with a cylindrical diamond saw and the exterior (or interior) of the hollow cylinder is diffused in a suitable diffusion chamber with a P-type impurity such as boron to form the junction. Other techniques will be apparent to those skilled in the art for forming the junction. The hollow cylindrical semiconductor form is then inserted between inner and outer cylindrical electrodes with suitable flexible seals at the opposite ends of the semiconductor which extend to the outer and inner concentric electrodes. The radial gap between the electrodes and semiconductor form are then filled with mercury to establish good electrical connection between the semiconductor and its electrodes. Other metals which are fluid at room temperature could also be used.

The height of the cylinder used can be as desired, and, with the diameter of the junction, determines the current carrying area and thus the current capacity of the device. Moreover, electrode connection is simplified by the use of the liquid mercury connection surface. Cooling of the device is extremely efficient since coolant flow can take place through the center of the cylinder and over its outer surface.

It is, therefore, a primary object of this invention to provide a novel high current capacity semiconductor device.

A further object of the invention is to provide a novel semiconductor structure having current ratings in excess of 500 amperes.

Yet another object of the invention is to provide a novel shape for a semiconductor structure which can be manufactured with extremely high areas for current conduction.

These and other objects of this invention will become apparent from the following description when taken in connection with the drawings in which.

Figures 1, 2:
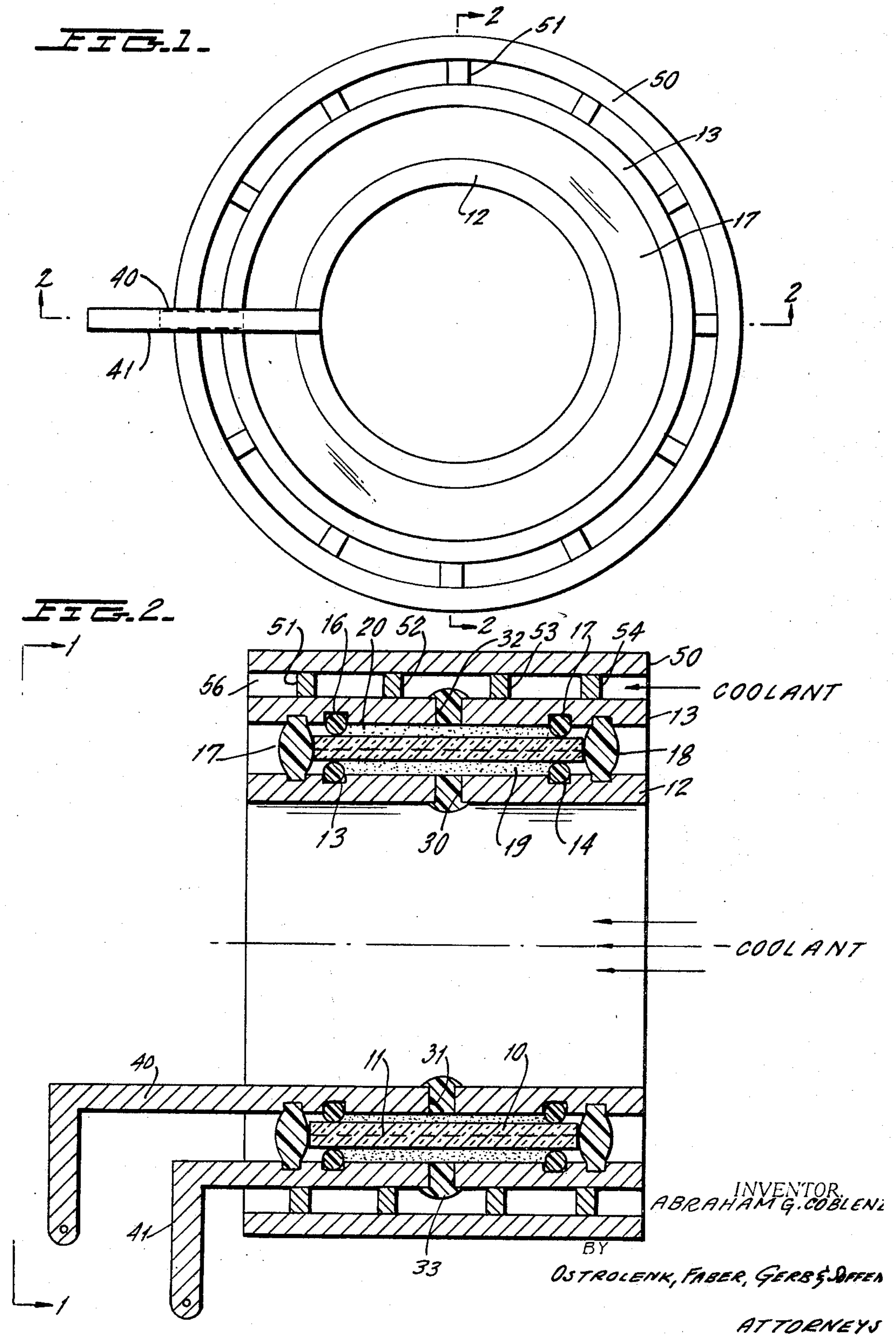
FIGURE 1 shows a top plan view of a device made in accordance with the invention.
FIGURE 2 shows a cross-sectional view of FIGURE 1 taken across section line 2—2 in FIGURE 1.

Referring to the figures, the hollow cylindrical semiconductor form 10 has a junction 11 therein, formed between an inner N-type conductivity region and an outer P-type conductivity region. The opening in form 10 can be formed by any desired well-known drilling process presently used for glass and silicon. After drilling, the surfaces are suitably cleaned and the junction passivated. The outer and inner surfaces of form 10 can be gold plated (not shown), or otherwise plated with a conductive material.

Semiconductor form 10 is concentrically positioned between copper cylinders 12 and 13, and is sealed thereto by sealing rings 13, 14, 15 and 16. End seals 17 and 18 are provided in abutment with the semiconductor form 10 to hold it in fixed axial position between cylinders 12 and 13. The radial spaces between form 10 and cylinders 12 and 13 is filled with mercury volumes 19 and 20, respectively, to insure good electrical and thermal contact of the inner and outer surfaces of form 10 with conductive cylinders 12 and 13, respectively. Suitable gates 30–31 and 32–33 are placed in cylinders 12 and 13 to permit loading of the mercury volumes 19 and 20 between seals 13–14 and 16–17, respectively. Gates 30 to 33 are subsequently plugged with a suitable plastic plug which also serve as expansion chambers which absorb volumetric changes of the mercury with temperature.

A first terminal 40 extends from one end of cylinder 12 and a second terminal 41 extends from cylinder 13.

To assist in cooling the device, a further concentric cylinder 50 can be connected around the exterior of cylinder 13 supported by suitable pins such as pins 51, 52, 53 and 54. This provides a radial channel 55 which can carry a suitable coolant over the exterior of conductive cylinder 13 while coolant can also flow through the tube defined by the interior of cylinder 12.

For typical devices, and for a 600 ampere device, the semiconductor is of silicon, having an outer diameter of 1.1875 inches with a 0.5 inch inner diameter and a height of 0.849 inch. A 1000 ampere device can be formed by increasing the height of the form to 1.415 inches, with each design providing a current density in the silicon of 450 amperes/square inch.

In a second design series and increasing the inner diameter to 1 inch, a 600 ampere device has a height of 0.4245 inch, while a 1000 ampere device has a height of 0.7075 inch.

Note that current rating increase is possible in accordance with the invention without increasing the diameter of the initial ingot (as required when using flat wafers), and by mere increasing the height of the cylinder.

It will be apparent that other junction configurations, beside the single junction rectifier, could be used, and the invention could be extended to application to transistors, controlled rectifiers, triacs, and the like.

Although this invention has been described with respect to its preferred embodiments, it should be understood that many variations and modifications will now be obvious to those skilled in the art, and it is preferred, therefore, that the scope of the invention be limited not be the specific disclosure herein, but only by the appended claims.

The embodiments of the invention in which an exclusive privilege or property is claimed are defined as follows:

1. A semiconductor device comprising a hollow cylindrical form of monocrystalline semiconductor material; a cylindrical junction formed in and concentric with said cylindrical form; a first hollow electrode secured to the interior diameter of said form; and a second electrode secured to the exterior diameter of said form; said first and second electrodes being insulated from one another.

2. The device set forth in claim 1 in which the outer diameter of said form is about 1 inch.

3. The device set forth in claim 1 which has an average current capacity of at least 500 amperes.

4. The device set forth in claim 1 which includes third and fourth cylindrical electrodes secured to the inner and outer surfaces of said first and second electrodes, respectively; said first and second electrodes formed of a fluid conductor; and seal means for retaining said first and second fluid conductors between said outer and inner diameters of said form and said fourth and third cylinders, respectively.

5. The device set forth in claim 3 which includes third and fourth cylindrical electrodes secured to the inner and outer surfaces of said first and second electrodes, respectively; said first and second electrodes formed of a fluid conductor; and seal means for retaining said first and second fluid conductors between said outer and inner diameters of said form and said fourth and third cylinders, respectively.

6. The device set forth in claim 5 which has an average current capacity of at least 500 amperes.

7. The device as set forth in claim 6 wherein said semiconductor material is silicon.

8. The device as set forth in claim 1 whereby the interior diameter of said first hollow electrode serves as a heat exchange fluid conductor.

9. The device as set forth in claim 8 which includes third and fourth cylindrical electrodes secured to the inner and outer surfaces of said first and second electrodes, respectively; said first and second electrodes formed of a fluid conductor; and seal means for retaining said first and second fluid conductors between said outer and inner diameters of said form and said fourth and third cylinders, respectively.

References Cited

FOREIGN PATENTS 365,804 1/1963 Switzerland.

JOHN W. HUCKERT, Primary Examiner

R. F. POLISSACK, Assistant Examiner

U.S. Cl. X.R.

317—235